COMPRESSION BONDED SEMICONDUCTOR DEVICE

Filed Jan. 14, 1965 2 Sheets-Sheet 1

INVENTOR.
JOHN L. BOYER
BY
OSTROLENK, FABER, GERB & SOFFEN
ATTORNEYS

COMPRESSION BONDED SEMICONDUCTOR DEVICE

Filed Jan. 14, 1965 2 Sheets-Sheet 2

INVENTOR.
JOHN L. BOYER
BY
OSTROLENK, FABER, GERB & SOFFEN
ATTORNEYS

United States Patent Office 3,328,650

Patented June 27, 1967

3,328,650 COMPRESSION BONDED SEMICONDUCTOR DEVICE

John L. Boyer, El Segundo, Calif., assignor to International Rectifier Corporation, El Segundo, Calif., a corporation of California Filed Jan. 14, 1965, Ser. No. 425,501

3 Claims. (Cl. 317—234)

ABSTRACT OF THE DISCLOSURE

A hermetically sealed housing for a semiconductor wafer in which the walls of the housing include the wafer expansion plates and an insulation ring section extending from conductive cylinders which are secured to the expansion plates. Only a single conductive cylinder is used with a conically shaped insulation ring. One of the expansion plates has a series of projections which serve to position the semiconductor wafer of the expansion plates.

This invention relates to a novel assemblage for a semiconductor wafer which may have one or more junctions therein, and more particularly relates to a novel support structure for semiconductor wafers wherein the electrodes serve as a portion of a hermetically sealing enclosure for the wafer.

It is well known that wafers having junctions therein should be hermetically sealed within the housing. To this end, the wafer is commonly manufactured by having conductive electrodes placed on its opposing surfaces, with this complete subassembly thereafter being contained within a hermetically sealing housing.

The principle of the present invention is to hermetically seal the bare wafer structure between its opposing electrodes, whereupon the normal electrode surfaces of the wafer now define the hermetic sealing housing. This can be accomplished by causing one of the electrodes to have an upwardly extending tube with an annular insulation member extending between this upper tube and the lower conductive electrode. Thus, the complete subassemblage of the wafer and its conductive electrodes now define a hermetically sealed subassembly which can subsequently be placed in a suitable mounting which will apply compressional forces to the opposing electrodes to obtain high pressure bonding between the electrodes and the wafer. Both sides of the wafer may be coated with gold or silver to provide a good contact.

Accordingly, a primary object of this invention is to provide a novel subassembly of a semiconductor wafer and electrodes therefor which can be placed into a compression bonding structure.

Another object of this invention is to provide a novel hermetically sealed wafer of semiconductor material wherein a portion of the hermetic sealing housing includes the wafer electrodes.

These and other objects of this invention will become apparent from the following description when taken in connection with the drawings, in which:

FIGURE 6 is a top view of the subassemblage of

Figure 1:
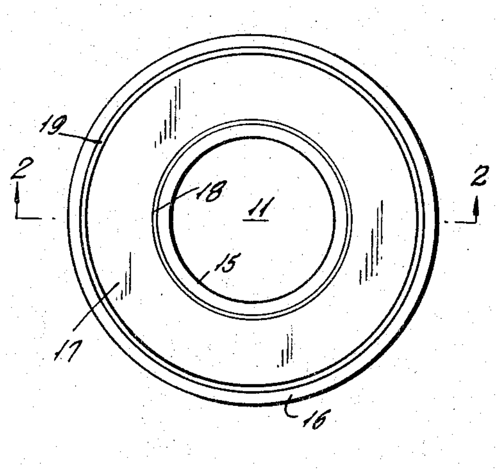
FIGURE 1 is a top view of the novel subassemblage of the invention.
Figure 2:
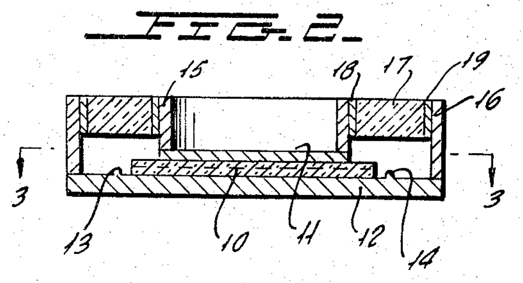
FIGURE 2 is a cross-sectional view of FIGURE 1 taken across the lines 2—2 in FIGURE 1.

FIGURES 1 and 2 when contained within a compression bonding housing.

Figures 6, 7:
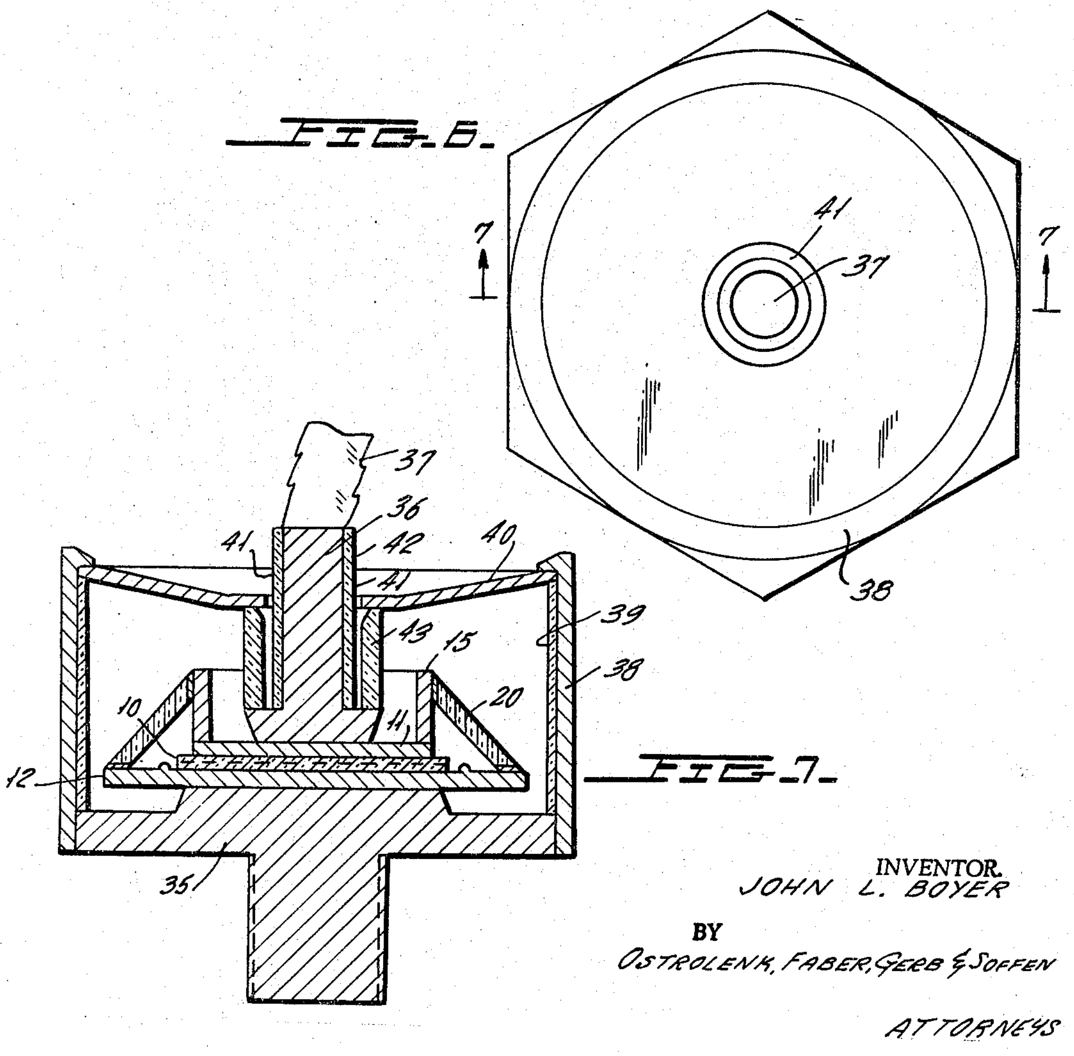

FIGURE 7 is a cross-sectional view of FIGURE 6 taken across the lines 7—7 in FIGURE 6.

Figure 8:
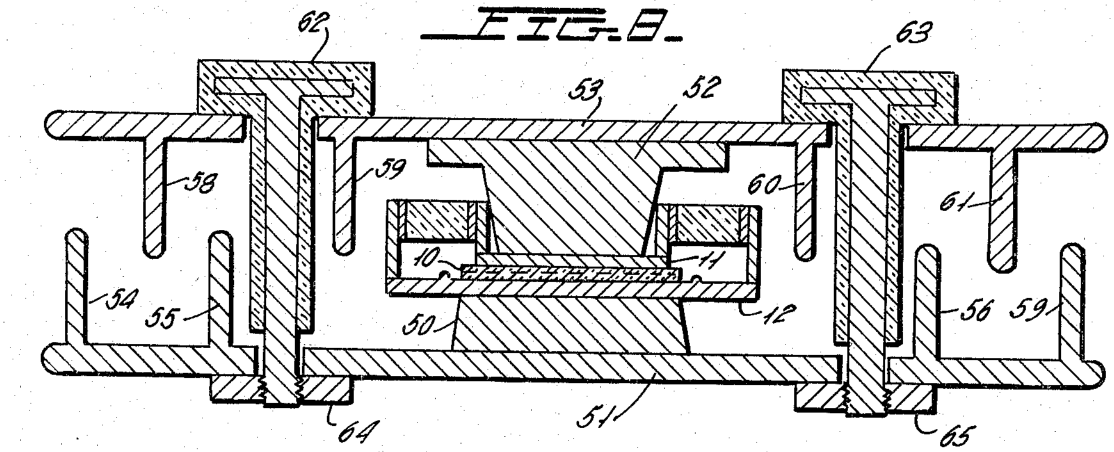

FIGURE 8 is a cross-sectional view of still another compression bonding housing formed in accordance with the invention.

Referring first to FIGURES 1 and 2, I have illustrated therein a subassemblage of a semiconductor wafer 10 which could be a silicon wafer having a single junction therein, as illustrated by dotted lines, whereby the wafer is useful in rectifying applications.

The present invention recognizes that such wafers can support large compressive forces, and that when low voltage devices are required, it is possible to combine the electrode materials with the encapsulation required for the wafer. Thus, the wafer 10 of FIGURE 2 will have a first electrode 11 on its upper surface and a second electrode 12 on its lower surface. The electrodes 11 and 12 are disks of some material having the same or similar temperature coefficients as the silicon wafer 10, and typically are formed of molybdenum or tungsten.

Figure 3:
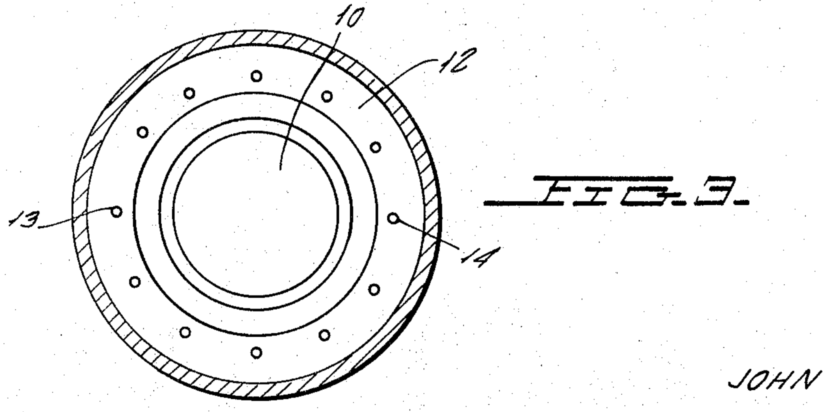
FIGURE 3 is a cross-sectional view of FIGURE 2 taken across the lines 3—3 in FIGURE 2.

In order to assist in the positioning of wafer 10 on the lower electrode plate 12, and as best shown in FIGURE 3, the plate 12 can have a plurality of small projections such as projections 13 and 14 which help in positioning the wafer 10 in the center of the plate. The electrode 11 then has a conductive tube 15 seated on its outer periphery, while the lower electrode 12 has a conductive tube 16 seated upon its outer periphery. An annular insulation disk 17, which has metallized inner and outer surfaces 18 and 19, respectively, is then located in the annular region between tubes 15 and 16, as illustrated.

This complete assemblage is thereafter brazed together as by placing the entire assemblage in a furnace with all of the joints between tube 16 and plate 12, tube 18 and plate 11, and tubes 15 and 16 to metallized regions 18 and 19, respectively, all being brazed at the same time. Alternatively, the various elements can be hand soldered, one at a time.

The end result, however, is a subassemblage of the type shown in FIGURE 2 wherein the complete subassembly contains the wafer 10 between plates 11 and 12 in a hermetically sealed manner. Moreover, plates 11 and 12 are insulated from one another by the annular insulator member 17 which could, for example, be of a suitable ceramic material.

Figure 4:
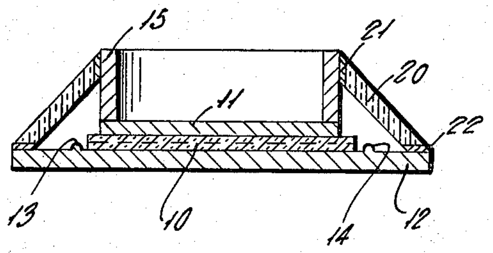
FIGURE 4 illustrates a cross-sectional view similar to FIGURE 2 of a second embodiment of the invention.

FIGURE 4 illustrates an alternative manner in which the hermetically sealed subassembly can be formed where the tube 16 of FIGURE 2 is eliminated, and a conically shaped insulator ring 20 extends directly from the tube 15 to the upper surface of disk 14. Note that the conical ring 20 has suitable metallized portions 21 and 22 to permit brazing of ring 20 to tube 15 and disk 14. In all other respects, the assemblage of FIGURE 4 is identical to that of FIGURE 2, but somewhat simplifies the manufacturing technique by eliminating the additional tube 16.

Figure 5:
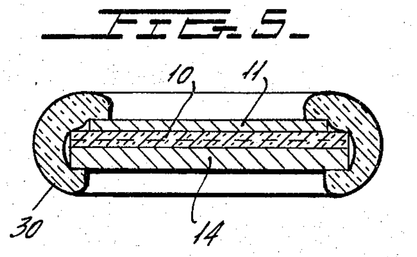
FIGURE 5 illustrates still another embodiment of the invention.

FIGURE 5 shows still a further embodiment of the invention wherein the connection between the lower electrode disk 14 and upper electrode disk 11 is formed by an annular bead 30 of some suitable glass or any suitable type of plastic which extends from the top of disk 11 around to the bottom of disk 14. Clearly, this annular bead will hermetically seal the semiconductor wafer 10, and will mechanically secure disks 11 and 14 against wafer 10.

Each of the subassemblies of FIGURES 2, 4 and 5 not only have the common characteristic of hermetically sealing their respective wafers, but also provide structures that can be directly used in compression bonding arrangements. That is to say, it is now necessary in each of the devices of FIGURES 2, 4 and 5 to provide a high compression force between disks 11 and 14 to force them into high pressure engagement with the wafer 10.

To this end, and as illustrated in FIGURE 6, the type housing shown in my copending application, Ser. No. 361,827, filed Apr. 22, 1964, entitled, "Compression Bonded Semiconductor Device," and assigned to the assignee of the instant invention, can be used. Thus, in FIGURES 6 and 7, the subassembly of FIGURE 4 is illustrated wherein the lower plate 12 seats upon the top surface of a conductive stud 35. The upper disk 11 receives conductive stud 36 which is connected to a pigtail conductor 37 in the usual manner. A metallic tube 38 is then brazed to the periphery of stud 35 and has an insulation lining 39 therein. The insulation lining 39 then receives a spring washer 40 which has an opening 41 therethrough for passing the stud 36, which may have the insulation coating 42 thereon to prevent accidental short circuiting of the stud.

The spring 40 then bears upon an insulation tube 43 which seats against a shoulder on stud 36 as illustrated, whereupon the spring 40 exerts a high compressional force between disks 11 and 12 to achieve high pressure contact between disks 11 and 12 and the wafer 10.

FIGURE 8 illustrates an alternative manner for mounting the novel subassembly of the invention, and particularly illustrates a subassembly of the type shown in FIGURE 2 as mounted by a compression bonding structure of the type shown in my copending application Ser. No. 361,400, now Patent 3,293,508, filed Apr. 21, 1964, entitled, "Compression Connected Semiconductor Device," and assigned to the assignee of the instant invention. Thus, in FIGURE 8, the conductive disk 12 seats upon a conductive body 50 which is carried on a lower conductive mounting plate 15. The upper disk 11 then receives an upper conductive body 52 which is carried from an upper conductive plate 53.

The lower plate 51 then has inwardly extending cooling fins 54, 55, 56 and 57, while the upper plate has similar, but off-set, cooling fins 58, 59, 60 and 61. The two plates are then clamped toward one another by a suitable insulating clamping bolt arrangement which includes the insulated bolts 62 and 63 (along with others, not shown) which pass through suitable aligned openings in plates 51 and 53, and are secured by suitable nuts 64 and 65, respectively. Clearly, by tightening nuts 64 and 65, a large compressional force will be applied to the disks 11 and 12, thereby supplying the required compressional force to obtain a low resistance and high thermal conductivity boundary between plates 11 and 12 and the wafer 10.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A hermetically sealed semiconductor device comprising a wafer of semiconductor material having at least one junction therein, a first electrode plate in surface-to-surface contact with the upper surface of said wafer, a second electrode plate in surface-to-surface contact with the bottom surface of said wafer, said first and second electrode plates having a temperature coefficient of expansion similar to that of said semiconductor material and peripheral sealing means extending around the peripheries of said first and second electrode plates and said wafer mechanically connected from said first electrode plate to said second electrode plate; said peripheral sealing means at least partially including an insulation ring for electrically insulating said first and second electrode plates; said first and second electrode plates defining the top and bottom walls of a hermetically sealing enclosure for said wafer; said second electrode plate having a plurality of projections extending around the periphery of said wafer to position said wafer within said projections.

2. The device substantially as set forth in claim 1 wherein said peripheral sealing means includes a first conductive cylinder of constant diameter secured at one end thereof to said first electrode plate and a second conductive cylinder of constant diameter secured at one end thereof to said second conductive cylinder; said first conductive cylinder being concentric with said second conductive cylinder; said insulation ring extending across the annular opening defined between the second ends of said first and second conductive cylinders.

3. The device substantially as set forth in claim 1 wherein said peripheral sealing means includes a conductive cylinder secured at one end thereof to one of said first or second plates; said insulation ring having a generally conical shape, and extending from the opposite end of said conductive cylinder to the other of said first or second plates.

References Cited

UNITED STATES PATENTS

| | | | |
|---|---|---|---|
| 2,756,374 | 7/1956 | Colleran et al. | 317—234 |
| 2,855,334 | 10/1958 | Lehovee | 317—234 X |
| 2,864,980 | 12/1958 | Mueller | 317—234 |
| 2,946,935 | 7/1960 | Finn | 317—234 |
| 3,280,389 | 10/1966 | Martin | 317—234 |

FOREIGN PATENTS

| | | |
|---|---|---|
| 1,120,428 | 4/1956 | France. |

JOHN W. HUCKERT, *Primary Examiner.*

A. M. LESNIAK, *Assistant Examiner.*